(12) United States Patent
Tsai et al.

(10) Patent No.: US 11,545,983 B2
(45) Date of Patent: Jan. 3, 2023

(54) SYSTEMS AND METHODS FOR PHASE LOCKED LOOP REALIGNMENT WITH SKEW CANCELLATION

(71) Applicant: Taiwan Semiconductor Manufacturing Company, Ltd., Hsinchu (TW)

(72) Inventors: Tsung-Hsien Tsai, Taoyuan County (TW); Ruey-Bin Sheen, Taichung (TW); Chih-Hsien Chang, New Taipei (TW); Cheng-Hsiang Hsieh, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/159,335

(22) Filed: Jan. 27, 2021

(65) Prior Publication Data

US 2022/0239298 A1 Jul. 28, 2022

(51) Int. Cl.
*H03L 7/089* (2006.01)
*H03D 13/00* (2006.01)
*H03L 7/099* (2006.01)
*H03L 7/093* (2006.01)

(52) U.S. Cl.
CPC ......... *H03L 7/0893* (2013.01); *H03D 13/004* (2013.01); *H03L 7/093* (2013.01); *H03L 7/099* (2013.01)

(58) Field of Classification Search
CPC ..... G06F 1/04; G06F 1/06; G06F 1/08; G06F 1/10; G06F 1/12; G06F 13/1668; G06F 13/1689; H03L 7/06; H03L 7/07; H03L 7/081; H03L 7/0812; H03L 7/0814; H03L 7/0816; H03L 7/085; H03L 7/0891; H03L 7/0893; H03L 7/0895; H03L 7/089; H03L 7/091; H03L 7/099; H03L 7/0995; H03L 7/0996; H03L 7/0997; H03L 7/0998
See application file for complete search history.

(56) References Cited

U.S. PATENT DOCUMENTS

| 5,633,899 | A | * | 5/1997 | Fiedler | H03L 7/0891 331/1 A |
| 6,597,219 | B1 | * | 7/2003 | Trivedi | H03L 7/0816 327/158 |
| 2007/0205816 | A1 | * | 9/2007 | Kim | H03L 7/0995 327/156 |
| 2008/0122544 | A1 | * | 5/2008 | Wang | H03L 7/093 331/17 |

* cited by examiner

*Primary Examiner* — Diana J. Cheng
(74) *Attorney, Agent, or Firm* — Jones Day

(57) ABSTRACT

Systems and methods are provided for a phase locked loop. A phase/frequency detector is configured to receive a reference signal and a feedback signal. A charge pump is configured to receive outputs from the phase/frequency detector and to generate pulses. An oscillator is configured to generate an output waveform based on the charge pump pulses. A realignment path is configured to generate a clock realignment signal that is provided to the oscillator based on the outputs from the phase/frequency detector.

20 Claims, 8 Drawing Sheets

SYSTEMS AND METHODS FOR PHASE LOCKED LOOP REALIGNMENT WITH SKEW CANCELLATION

TECHNICAL FIELD

This disclosure is related to circuit timing and more particularly to phase locked loops for generating circuit clocks.

BACKGROUND

High speed clock signals have a variety of applications including wireless data communication and medical devices and instrumentation. A phase locked loop (PLL) is a device that is typically implemented to lock the phase and frequency of a first device, often a higher frequency local oscillator device such as a voltage controlled oscillator (VCO), to a second device, often a lower frequency reference device such as a temperature compensated (TCXO) or oven controlled oscillator (OCXO). The PLL is utilized because the phase and frequency of the first, typically higher frequency device, may not be very stable over temperature and time, where the second device has better behavior regarding those characteristics.

BRIEF DESCRIPTION OF THE DRAWINGS

Aspects of the present disclosure are best understood from the following detailed description when read with the accompanying figures.

DETAILED DESCRIPTION

Figure 1:
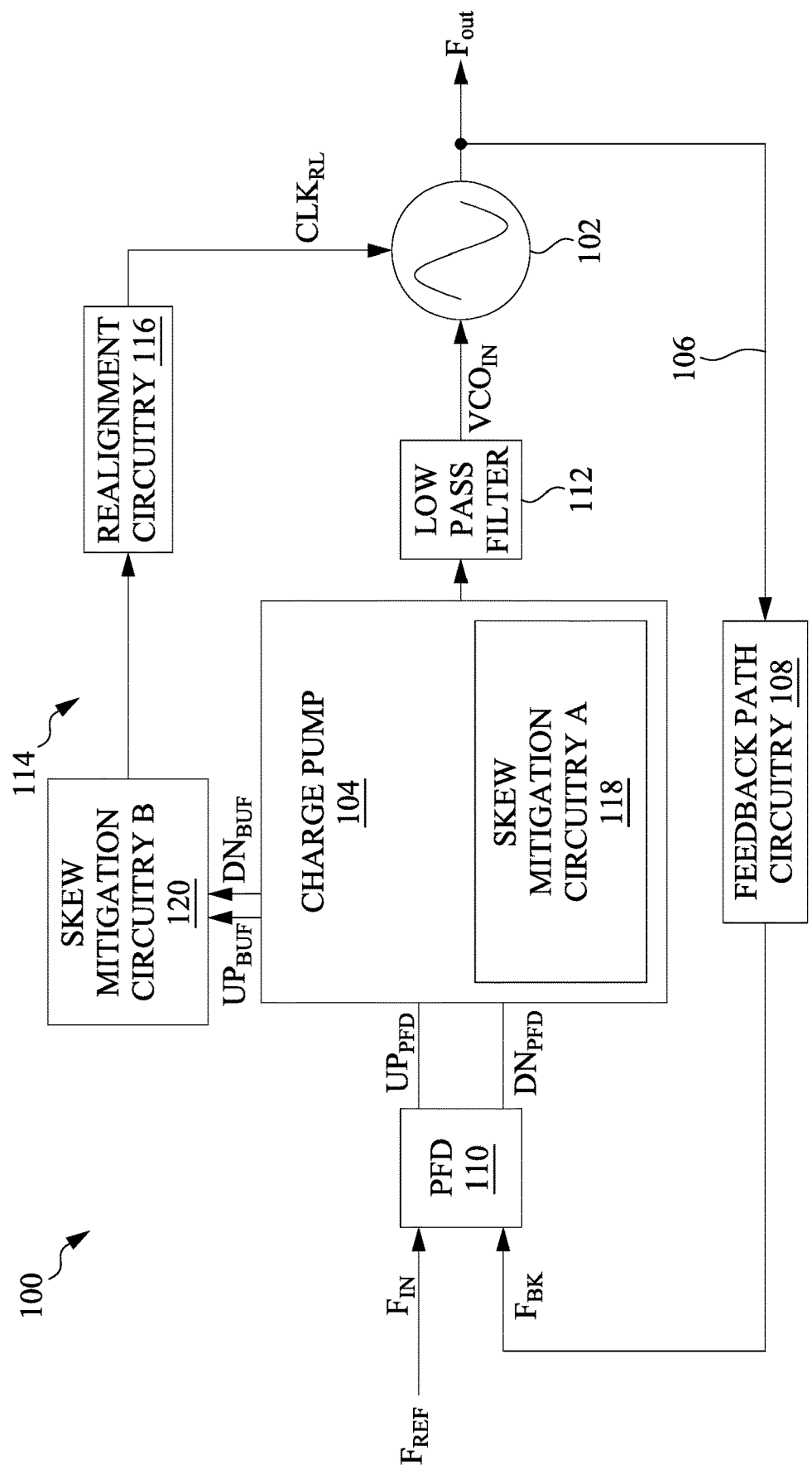
FIG. 1 is a block diagram depicting a phase locked loop with charge pump based realignment in accordance with embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As described above, a PLL may be used to maintain correct operating behavior of a high frequency oscillator (e.g., a VCO as described in the examples herein). But a PLL itself may behavior off nominally at times, sometimes based on small amounts of error accumulated over time. To account for such imperfect PLL behavior, a PLL may be implemented with a realignment path that is configured to generate a clock realignment signal that is provided to the VCO (e.g., periodically, on command, upon occurrence of an error or other predetermined condition) to realign VCO operation with the reference device. Proper alignment of the clock realignment signal with a current state of the VCO and PLL may be important, in some embodiments, to achieving a proper realignment operation such that a locking condition is not broken. Systems and methods herein, in embodiments, provide accurately timed clock realignment signals to the VCO.

FIG. 1 is a block diagram depicting a phase locked loop with charge pump based realignment in accordance with embodiments. A PLL 100 controls a VCO 102 that is configured to generate a periodic output waveform ($F_{out}$) based on charge pump pulses generated by a charge pump 104 and a realignment signal ($CLK_{rl}$). The example PLL 100 operates as a negative feedback system that locks the phase and frequency of VCO 102 to a typically lower frequency signal from a more stable device provided at $F_{ref}$. A feedback path 106 includes feedback path circuitry 108 that, in embodiments, includes a frequency divider to reduce the VCO output frequency $V_{out}$ to approximately match that of the reference frequency $F_{ref}$. A phase/frequency detector (PFD) 110 receives the reference frequency, in embodiments after some amount of delay as described further herein, at $F_{in}$ and a feedback signal from the feedback path 106 at $F_{bk}$. The PFD 110 compares the signals received at $F_{in}$, $F_{bk}$, and generates control signals $Up_{pfd}$ and $DN_{pfd}$ directing the charge pump 104 to sink or source current pulses at the $F_{ref}$ rate. Those current pulses from the charge pump 104 are processed by a low pass filter 112 to generate a voltage $VCO_{in}$ that is applied to the tuning port of the VCO, an adjustment process that continues until the inputs ($F_{in}$, $F_{bk}$) to the PFD are equal and in phase. When those inputs are equal, the PLL 100 is said to be locked.

Despite a locked condition, phase noise, spurious signals, and other phenomena may over time contribute to anomalous behavior by the PLL, resulting in a suboptimal output of the VCO. To mitigate that suboptimal behavior, a realignment path 114 provides (e.g., periodically) a clock realignment pulse $CLK_{rl}$ to the VCO using realignment circuitry 116 that, in embodiments, comprises a pulse generator. The realignment circuitry 116 receives an input signal that is based on signals $Up_{buf}$ and $DN_{buf}$ received directly from, just before, or near the charge pump 104. To maintain proper alignment of the click realignment signal $CLK_{rl}$ with the current state of the VCO and PLL so as to not break a locked condition of the loop 100, the charge pump 104 and the realignment path 114 may include matching skew mitigation circuitry 118, 120 that respectively process the $Up_{buf}$ and $DN_{buf}$ signals using matched circuitry. For example, skew mitigation circuitry A 118 may process $U_{buf}$ using a first logic gate and $DN_{buf}$ using a second logic gate, while skew mitigation circuitry B 120 processes both $Up_{buf}$ and $DN_{buf}$ using a third logic gate, where the first, second, and third logic gates are of the same type (e.g., AND gates, OR gates), and in embodiments, identical logic gates (e.g., same part number, same type of gate on a multi-gate integrated circuit).

Figure 2:
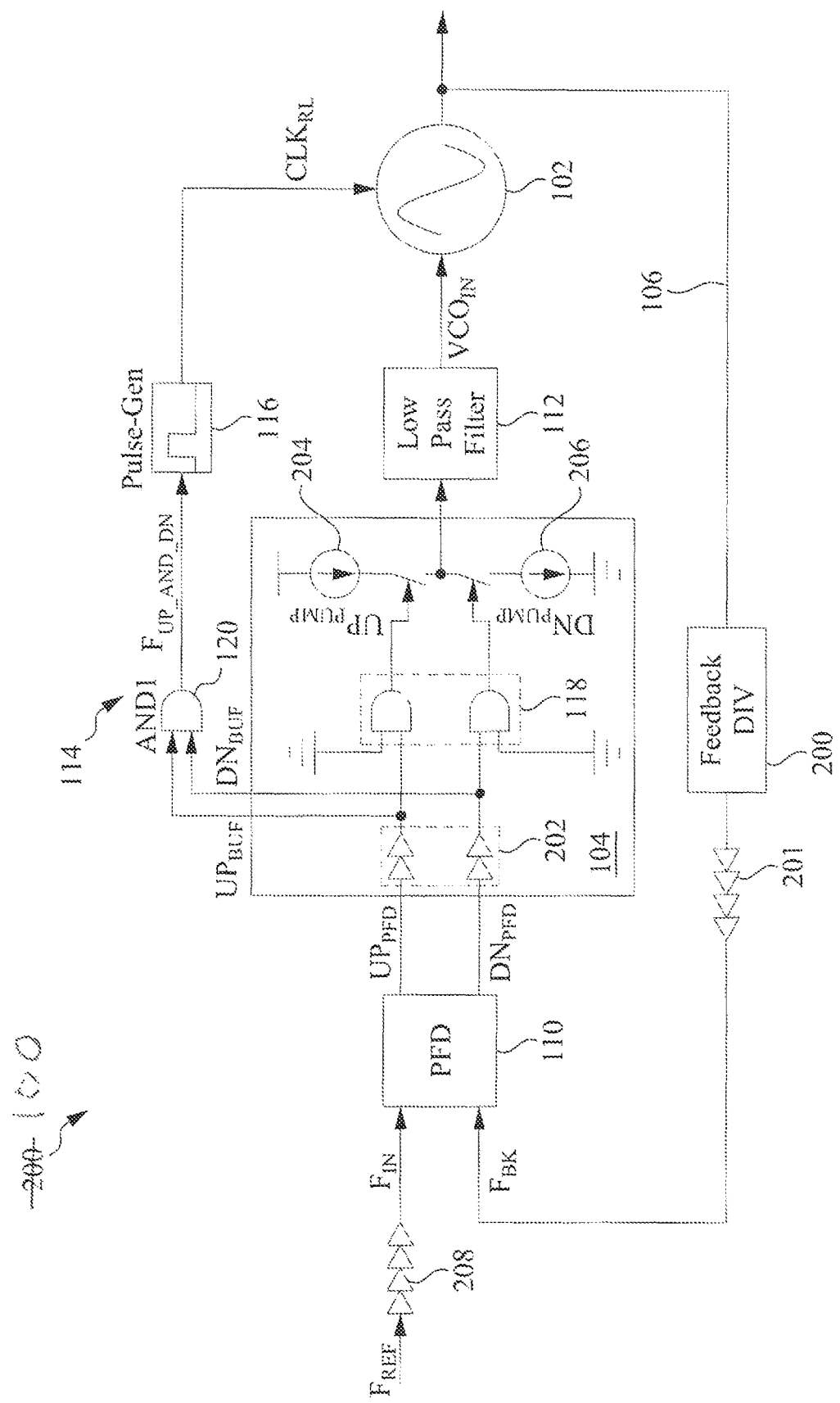
FIG. 2 is a diagram depicting a phase locked loop with matching skew mitigation circuitry in accordance with an embodiment.

FIG. 2 is a diagram depicting a phase locked loop with matching skew mitigation circuitry in accordance with an embodiment. The PLL 100 includes a PFD 110 that receives a reference signal $F_{ref}$ at $F_{in}$ and a feedback signal from feedback path circuitry 108 (e.g., a frequency divider 200 and buffers 201) after feedback loop 106 at $F_{bk}$ and generates outputs $Up_{pfd}$, $DN_{pfd}$ based on a comparison of the frequency and phase of those input signals at $F_{in}$, $F_{bk}$. A charge pump 104 receives the PFD 110 outputs and uses those outputs to generate current pulses that are provided to a low pass filter 112 that converts the current pulses to a voltage level $VCO_{IN}$ that is provided to a VCO 102. The PLL 100 further includes a realignment path 114 configured to generate a clock realignment signals $CLK_{rl}$ that is provided to the VCO 102 based on outputs from the PFD 110 (i.e., signals originating from $UP_{pfd}$, $DN_{pfd}$).

With further reference to the charge pump 104, the charge pump 104 receives inputs $Up_{pfd}$, $DN_{pfd}$ from PFD 110 and may, in embodiments provide those input signals to buffers 202. In embodiments, the amount of delay provided by the buffers 202 is user controllable during a design phase, such as in using computer-aided circuit design software. The buffered outputs from 202 $UP_{buf}$, $DN_{buf}$ are provided to skew mitigation circuitry A at 118. In the example of FIG. 2, the skew mitigation circuitry 118, 120 is implemented using AND gates. Skew mitigation circuitry A 118 comprises AND gates having one of their inputs tied high and the other input receiving a respective one of $Up_{buf}$, $DN_{buf}$ to produce $Up_{pump}$, $DN_{pump}$, respectively. The $Up_{pump}$ signal controls a switch that is connected to a current source 204 so as to source current pulses to the low pass filter 112 based on the $UP_{pump}$ signal. The $DN_{pump}$ signal controls a switch that is connected to another current source 206 so as to sink current pulses to the low pass filter 112 based on the $DN_{pump}$ signal.

Further regarding the realignment path 114, skew mitigation circuitry B 120 receives $UP_{buf}$ and $DN_{buf}$ from the charge pump 104. Skew mitigation circuitry B 120 is implemented using a substantially identical, or identical, AND gate as those used in skew mitigation circuitry A 118 (e.g., same type of gate, same size of gate, same part number). Skew mitigation circuitry B 120 provides both $UP_{buf}$ and $DN_{buf}$ to the AND gate inputs to generate $F_{up\_and\_dn}$ that is provided to a pulse generator realignment circuitry 116. The pulse generator 116 provides the clock realignment signal $CLK_{rl}$ based on receipt of the $F_{up\_and\_dn}$ signal, where in embodiments, a width of the clock realignment signal $CLK_{rl}$ is controllable, such as described further herein.

The example realignment path 114 of FIG. 2 provides multiple features that individually, or collectively, maintain alignment of the clock realignment signal $CLK_{rl}$ with a current state of the VCO and PLL to avoid breaking of a locked condition of the loop 100 during realignment. First, the use of post-PFD 110 signals as inputs to the realignment path 114 mitigates difficulty in estimating buffer delays during a design phase of a circuit. As noted above, certain buffer delays (e.g., delay from buffers 202) may be user controlled during computer-aided circuit design. But other signal buffering (e.g., buffering at 208 between $F_{ref}$ and $F_{in}$ may in some instances be selected by the an automated place and route routine of the computer-aided circuit design software to account for timing with other components of a larger circuit in which the PLL 100 appears. The indeterminate amount of buffer delay at 208 would introduce uncertainty in the realignment path 114 if the realignment path 114 were sourced from prior to PFD 110 (e.g., from near the $F_{REF}$ source prior to buffers 208). Early sourcing of the realignment path signal 114 may require use of a programmable delay line or a delay lock loop to account for the indeterminate total delay from 208 and 202. By sourcing the realignment path signal 114 from after 208 (and 202 in embodiments), any need for a programmable delay line or delay lock loop can be avoided.

Second, alignment of the clock realignment signal $CLK_{rl}$ with the current state of the VCO and PLL is improved through use of identical or substantially identical structures (e.g., logic gates, one or more transistors) at skew mitigating circuitry 118, 120. The use of identical or substantially identical gates results in the timing from the output of buffers 202 to the input of the low pass filter 112 being substantially identical to timing from the output of buffers 202 to the input of pulse generator 116. In embodiments, skew mitigation circuitry A 118 compensates for latency from the combination of $UP_{buf}$ and $DN_{buf}$ at 120 by using a common logic gate design for each of the depicted logic gates at 118, 120. Thus, in embodiments, when the PLL 100 is in a locked status, $F_{in}$ aligns with $F_{bk}$ and $UP_{pfd}$ aligns with $DN_{pfd}$ with both of those signals having a common pulse width, where phase error contributions to VCO are mitigated by $F_{up\_and\_dn}$ being aligned with $UP_{pump}$ and $DN_{pump}$.

Figure 3:
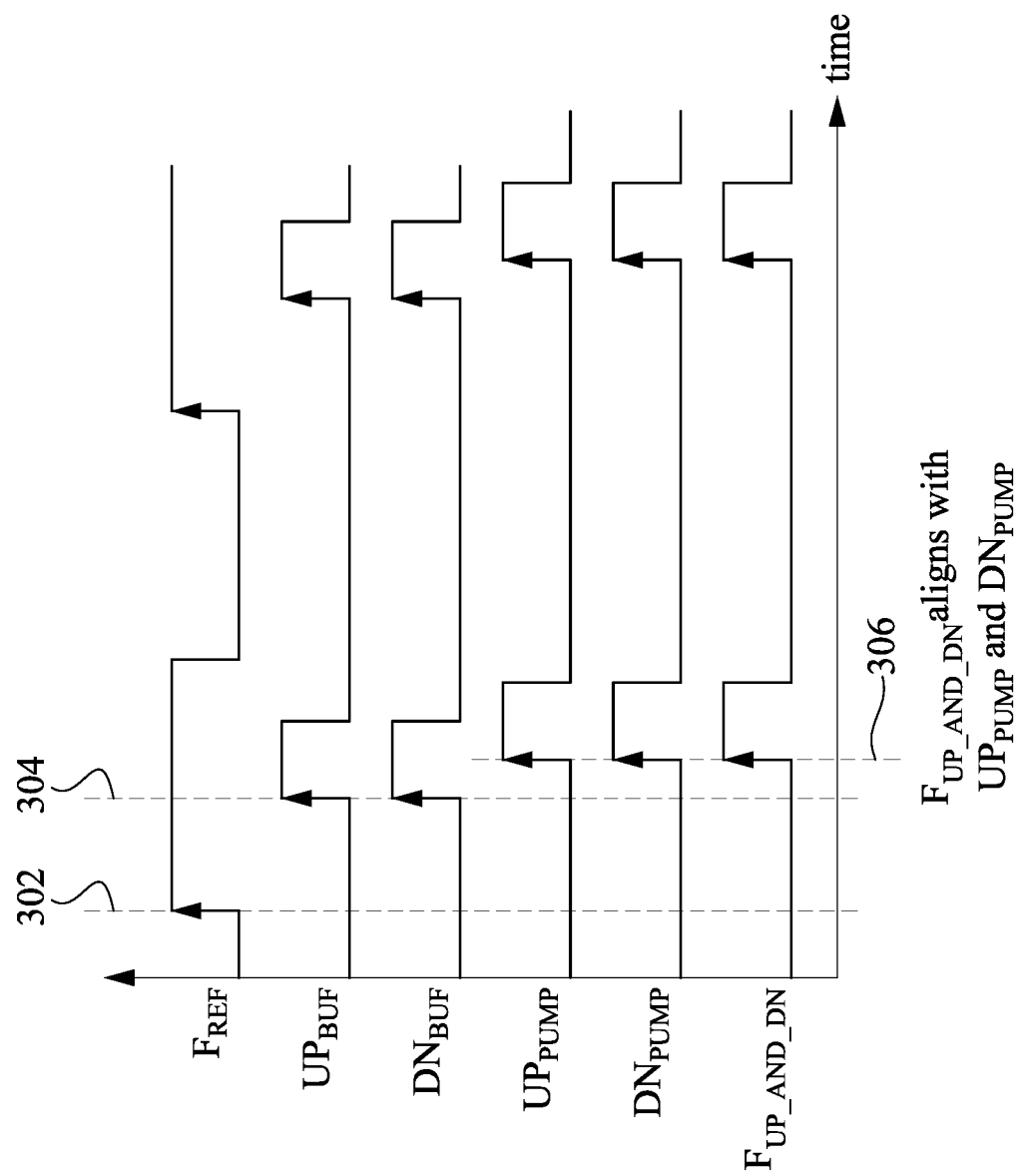
FIG. 3 depicts relative timing of signals described above with respect to FIG. 2.

FIG. 3 depicts relative timing of signals described above with respect to FIG. 2. At 302, the reference signal $F_{ref}$ transitions high. Following, in some instances, a delay of unknown length during design prior to auto place and route, PFD 110 comparison of signals at $F_{in}$ and $F_{bk}$, and further buffering at 202, $UP_{buf}$ and $DN_{buf}$ transition high at 304 in alignment during a locked state of the PLL 100. $UP_{buf}$ traverses its AND gate in skew mitigation circuitry A 118, $DN_{buf}$ traverses its AND gate in skew mitigation circuitry A 118, and both $UP_{buf}$ and $DN_{buf}$ are processed at the AND gate in skew mitigation circuitry B 120 to form $UP_{pump}$, $DN_{pump}$, and $F_{up\_and\_dn}$, which transition high at 306 in unison during a locked state of the PLL 100.

In has been observed that in some instances the realignment path exhibits improved function when pulse widths from PFD 110 are larger than the pulse width output from pulse generator 116 and when the pulse width from the pulse generator 116 is less than half the period of the VCO clock. That is:

$$PFD_{pulse\_width} > Pulse\ Generator_{pulse\_width}; \text{ and}$$

$$Pulse\ Generator_{pulse\_width} < 0.5 * VCO_{period}.$$

Figure 4:
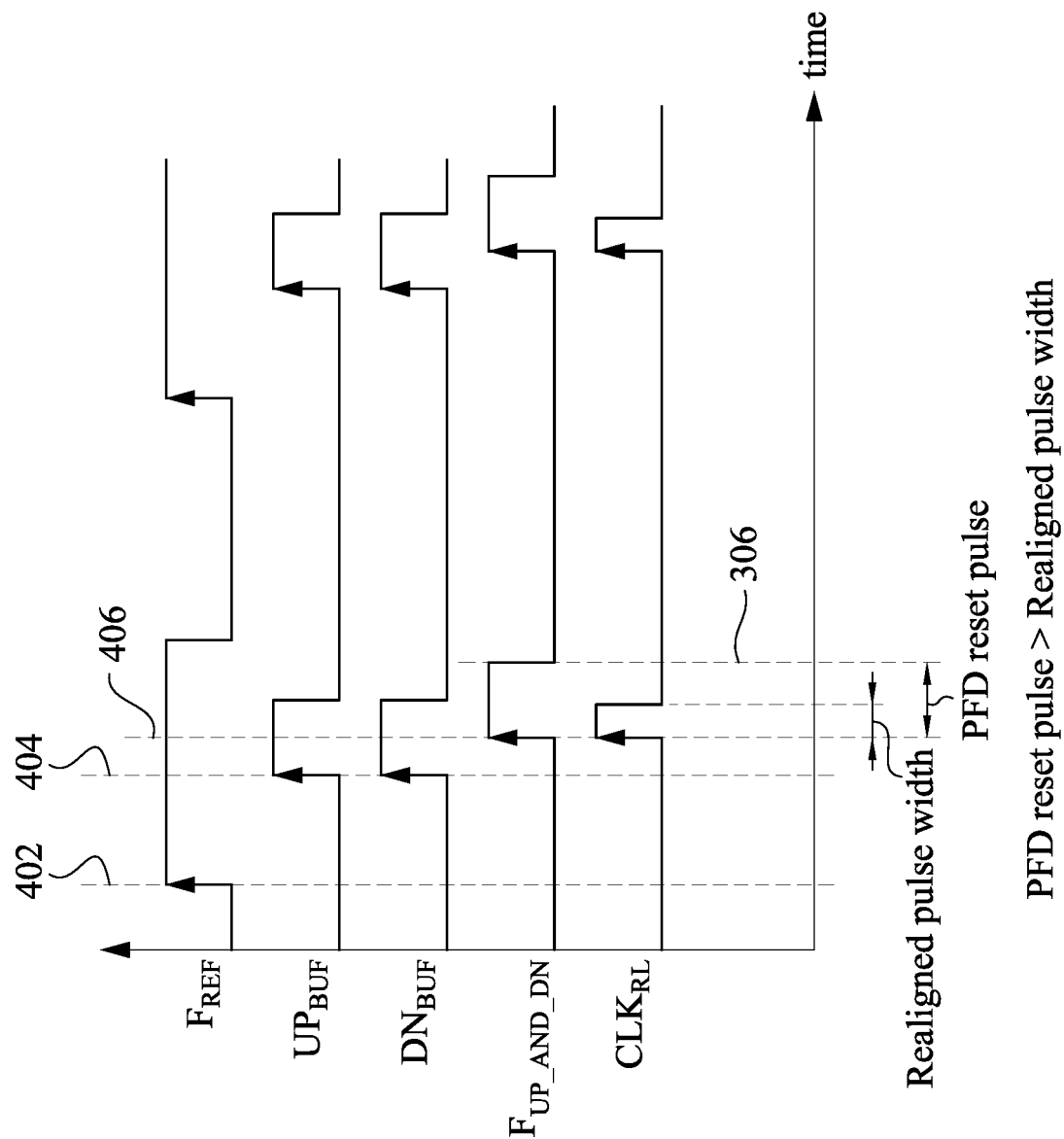
FIG. 4 is a diagram depicting relative pulse widths of PLL signals in accordance with an embodiment.

FIG. 4 is a diagram depicting relative pulse widths of PLL signals in accordance with an embodiment. At 402, the reference signal $F_{ref}$ transitions high. PFD 110 compares signals at $F_{in}$ and $F_{bk}$, and after buffering at 202, $UP_{buf}$ and $DN_{buf}$ transition high at 404 in alignment during a locked state of the PLL 100. Both $UP_{buf}$ and $DN_{buf}$ are processed at the AND gate in skew mitigation circuitry B 120 to form $F_{up\_and\_dn}$, which commands the pulse generator 116 to generate the clock realignment signal $CLK_{rl}$. Each of $UP_{buf}$, $DN_{buf}$, and $F_{up\_and\_dn}$'s pulse widths are based on pulse widths output from PFD 110 (PFD reset pulse). In the example of FIG. 4, the pulse generator 116 is configured to output a pulse having a width (realigned pulse width) that is both less than one half of the $VCO_{period}$ as well as smaller than the $PFD_{pulse\_width}$, or conversely the PFD reset pulse width is greater than the realigned pulse width.

Figure 5:
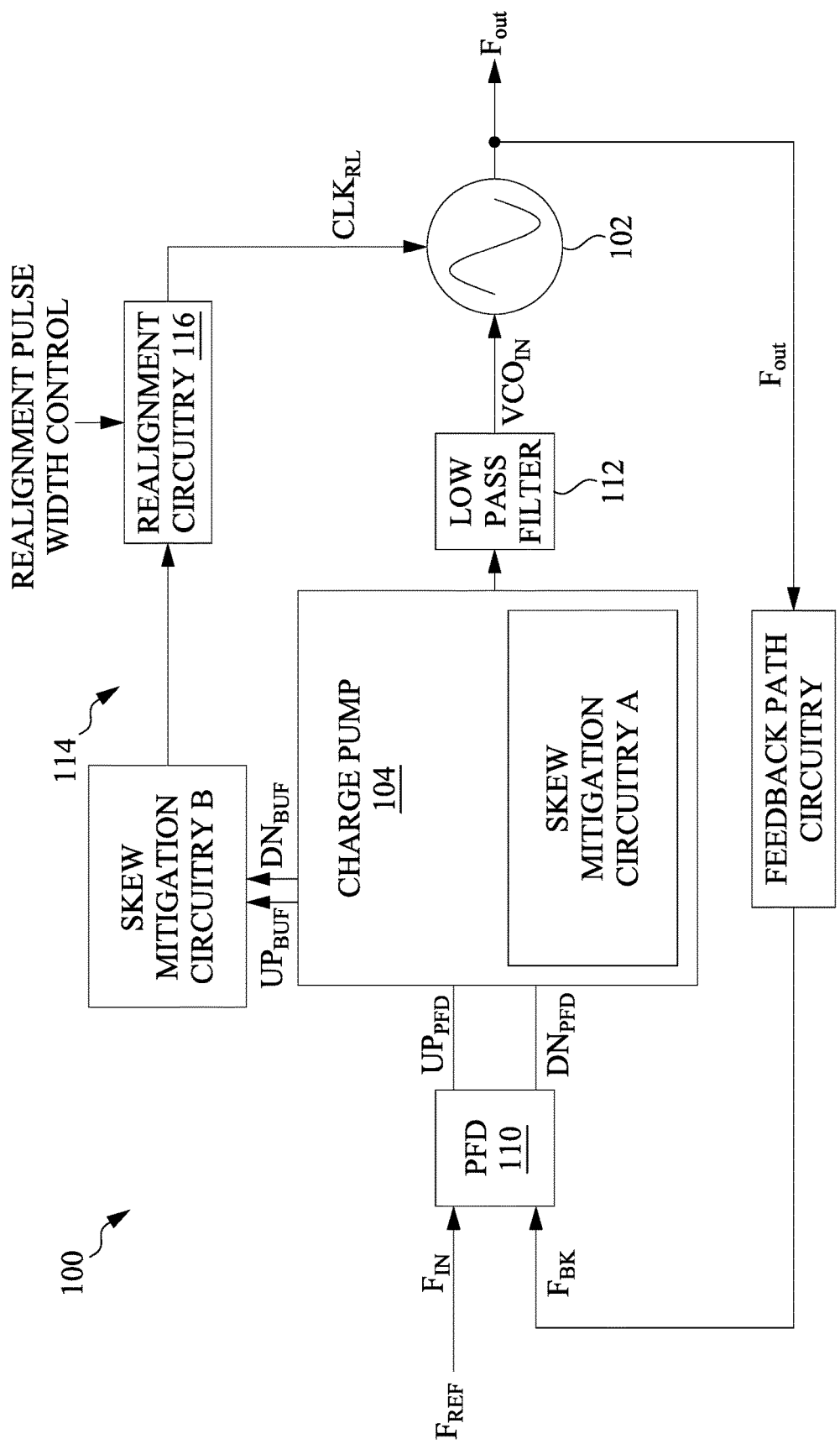
FIG. 5 is a diagram depicting a PLL having a pulse generator that operates based on a realignment pulse width control signal.

To ensure that a realignment path pulse width according to desirable parameters can be provided, in embodiments, pulse generator 116 is implemented using a configuration that controls pulse width according to a modifiable control parameter. FIG. 5 is a diagram depicting a PLL having a pulse generator that operates based on a realignment pulse width control signal. The PLL 100 includes a PFD 110 that receives a reference signal at $F_{in}$ and a feedback signal at $F_{bk}$. A charge pump 104 receives outputs from the PFD and generates pulses that are output to a low pass filter 112 which provides a control voltage VCO$_{in}$ to the VCO. A realignment path 114 includes clock realignment circuitry 116 configured to generate a clock realignment signal CLK$_{rl}$ that is provided to the VCO 102. In the embodiment of FIG. 5, the realignment circuitry 116 receives a realignment pulse width control signal 502 that is configured to control a pulse width of the clock realignment signal CLK$_{rl}$, such as to meet the above described pulse width criteria.

Figure 6:
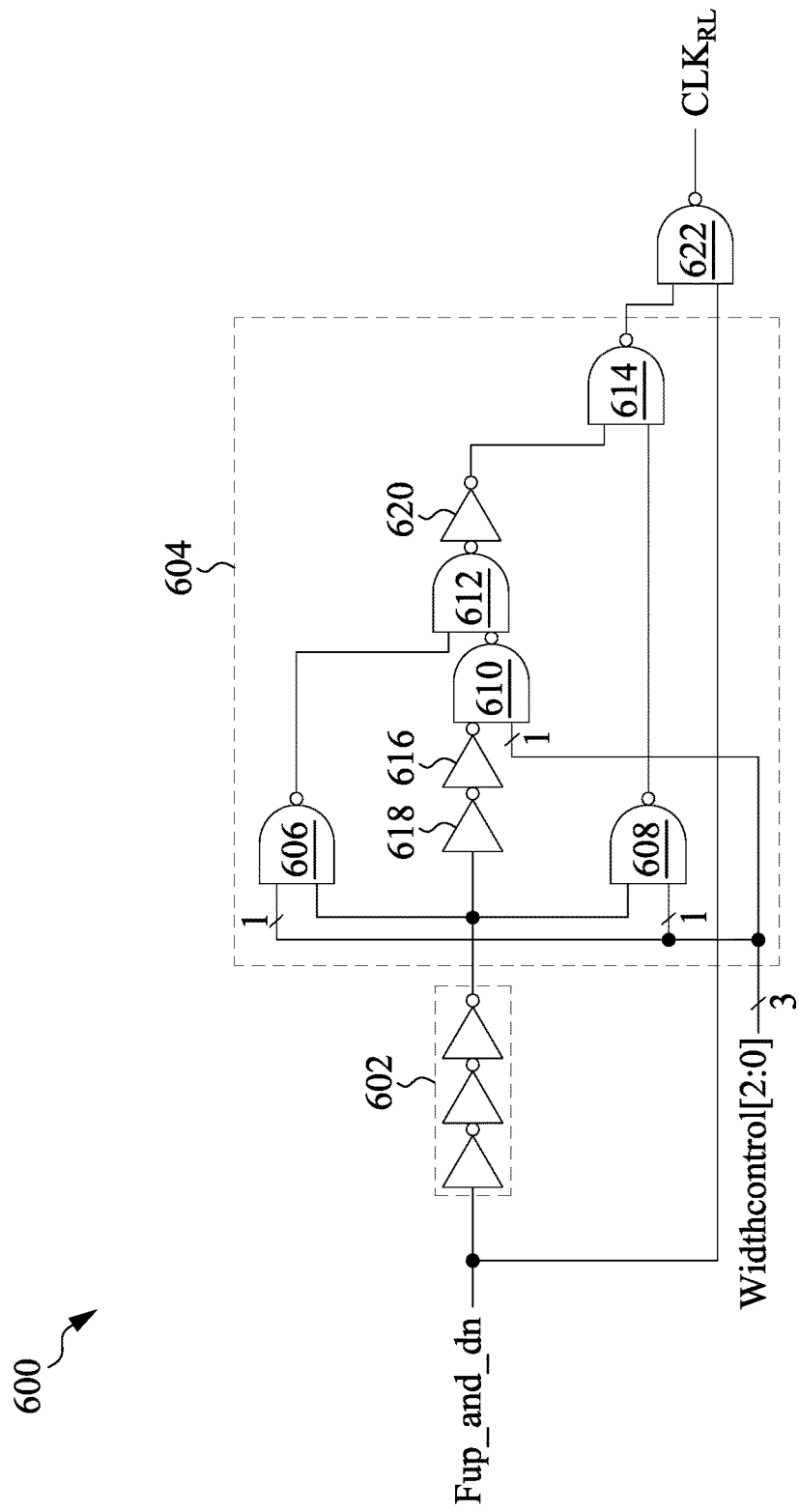
FIG. 6 is a diagram depicting a pulse generator having a controllable pulse width in accordance with embodiments.

FIG. 6 is a diagram depicting a pulse generator having a controllable pulse width in accordance with embodiments. The pulse generator 600 receives an input F$_{up\_and\_down}$ and provides a clock realignment signal CLK$_{rl}$ at its output based on a width control signal (Widthcontrol[2:0]) Specifically, F$_{up\_and\_down}$ is received by an inverter train 602, which operates to delay and invert F$_{up\_and\_down}$. The delayed and inverted version of F$_{up\_and\_down}$ is received by a width control circuit 604 that includes NAND gates 606, 608, 610, 612, 614 and inverters 616, 618, 620 electrically coupled together as shown. The width control circuit 604 also receives a three-bit width control signal [2:0] and uses this received signal to control the width of the pulses generated by the pulse generator 600.

More specifically, as seen in the example embodiment of FIG. 6, a first bit of the three-bit width control signal [2:0] is received at the NAND gate 606, a second bit of the three-bit width control signal [2:0] is received at the NAND gate 608, and a third bit of the three-bit width control signal [2:0] is received at the NAND gate 610. The table below illustrates an example scheme by which the three-bit width control signal [2:0] may be used to control the width of the pulses generated by the pulse generator 600:

| Width control[2.0] | Pulse width |
|---|---|
| 3'b001 | Level0 (narrow) |
| 3'b010 | Level1 (middle) |
| 3'b100 | Level2 (wide) |

As seen in the table above, in this example, if the first bit (e.g., least-significant bit) is high (e.g., logic-level high or "1"), and the second and third bits are low (e.g., logic-level low or "0"), then the pulse signal generated by the pulse generator 600 has a first width (e.g., a narrowest width). Further, in this example, if the third bit (e.g., most-significant bit) is high, and the first and second bits are low, then the pulse signal generated by the pulse generator 600 has a second width (e.g., a widest width). Additionally, in this example, if the second bit is high, and the first and third bits are low, then the pulse signal generated by the pulse generator 600 has a third width (e.g., a medium width that is between the aforementioned narrowest and widest widths). Further details of example operation of a controllable pulse width generator are described in U.S. patent application Ser. No. 16/744,413, entitled "Oscillator Circuits and Methods for Realignment of an Oscillator Circuit," the entirety of which is herein incorporated by reference.

Figure 7:
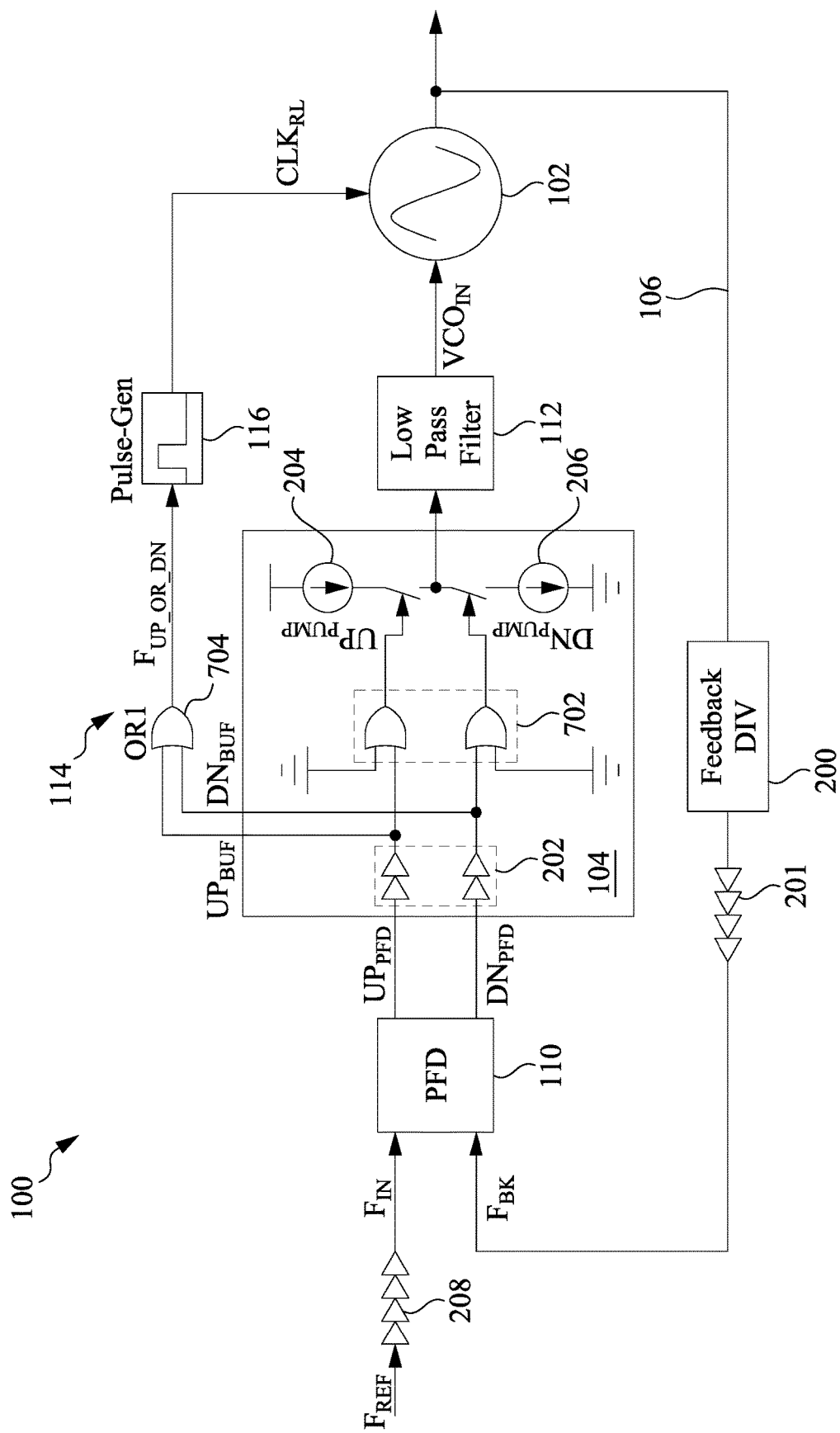
FIG. 7 depicts a phase locked loop that utilizes OR-gate skew mitigation circuitry in accordance with embodiments.

While prior examples have utilized AND gates in implementing skew mitigation circuitry A and B 118, 120, other circuitry, such as different logic gates or different circuit components (e.g., transistors) may be used. FIG. 7 depicts a phase locked loop that utilizes OR-gate skew mitigation circuitry in accordance with embodiments. The PLL 100 includes a PFD 110 that receives a reference signal F$_{ref}$ at F$_{in}$ and a feedback signal from feedback path circuitry 108 (e.g., a frequency divider 200 and buffers 201) after feedback loop 106 at F$_{bk}$ and generates outputs Up$_{pfd}$, DN$_{pfd}$ based on a comparison of the frequency and phase of those input signals at F$_{in}$, F$_{bk}$. A charge pump 104 receives the PFD 110 outputs and uses those outputs to generate current pulses that are provided to a low pass filter 112 that converts the current pulses to a voltage level VCO$_{IN}$ that is provided to a VCO 102. The PLL 100 further includes a realignment path 114 configured to generate a clock realignment signals CLK$_{rl}$ that is provided to the VCO 102 based on outputs from the PFD 110 (i.e., signals originating from UP$_{pfd}$, DN$_{pfd}$).

With further reference to the charge pump 104, the charge pump 104 receives inputs Up$_{pfd}$, DN$_{pfd}$ from PFD 110 and may, in embodiments provide those input signals to buffers 202. The buffered outputs from 202 Up$_{buf}$, DN$_{buf}$ are provided to skew mitigation circuitry A at 702. In the example of FIG. 7, the skew mitigation circuitry 702, 704 is implemented using OR gates. Skew mitigation circuitry A 702 comprises AND gates having one of their inputs tied low and the other input receiving a respective one of Up$_{buf}$, DN$_{buf}$ to produce Up$_{pump}$, DN$_{pump}$, respectively. The Up$_{pump}$ signal controls a switch that is connected to a current source 204 so as to source current pulses to the low pass filter 112 based on the UP$_{pump}$ signal. The DN$_{pump}$ signal controls a switch that is connected to another current source 206 so as to sink current pulses to the low pass filter 112 based on the DN$_{pump}$ signal.

Further regarding the realignment path 114, skew mitigation circuitry B 704 receives UP$_{buf}$ and DN$_{buf}$ from the charge pump 104. Skew mitigation circuitry B 704 is implemented using a substantially identical, or identical, OR gate as those used in skew mitigation circuitry A 702. Skew mitigation circuitry B 704 provides both UP$_{buf}$ and DN$_{buf}$ to the OR gate inputs to generate F$_{up\_or\_dn}$ that is provided to a pulse generator realignment circuitry 116. The pulse generator 116 provides the clock realignment signal CLK$_{rl}$ based on receipt of the F$_{up\_or\_dn}$ signal.

Figure 8:
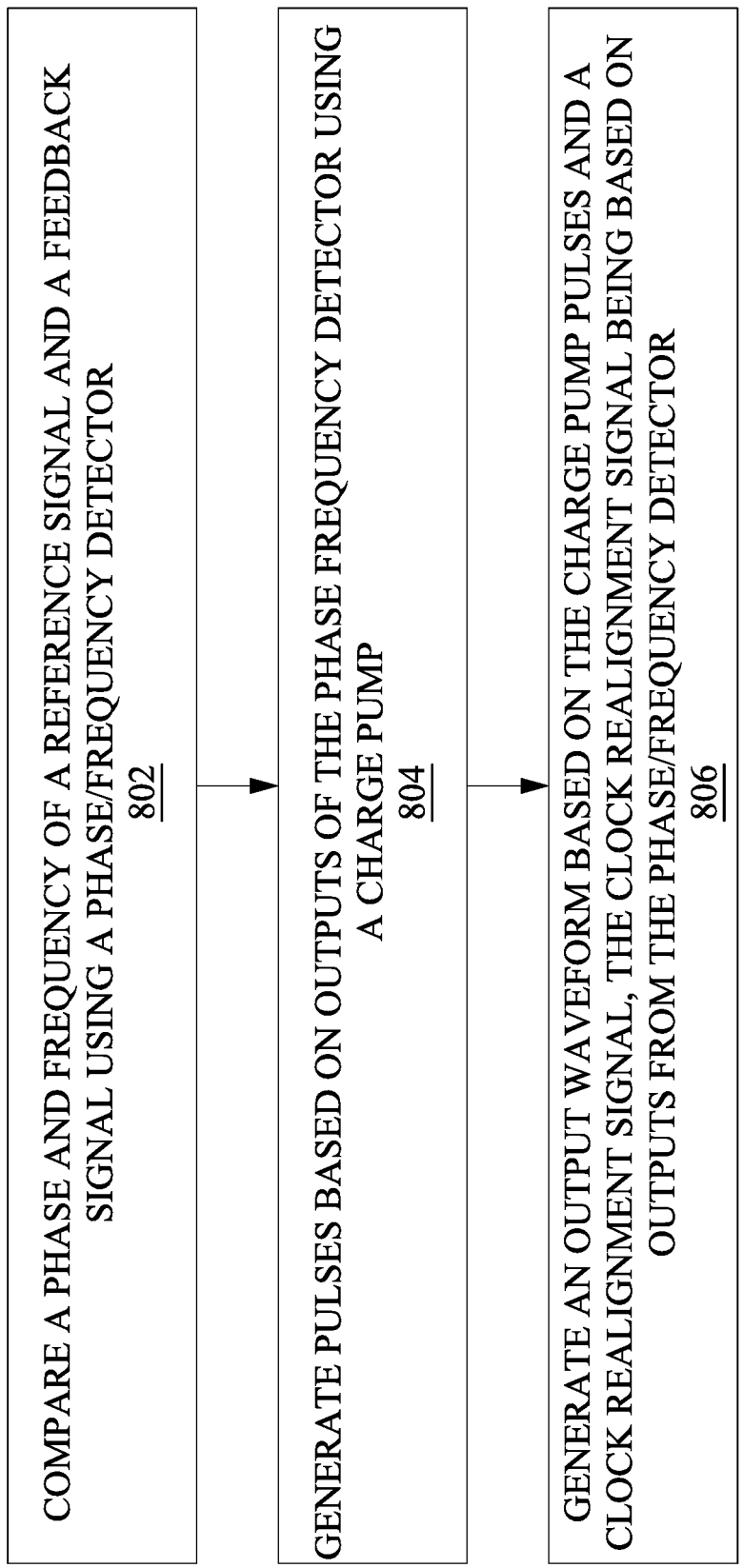
FIG. 8 is a flow diagram depicting a method of generating a periodic output waveform.

FIG. 8 is a flow diagram depicting a method of generating a periodic output waveform. The method includes comparing a phase and frequency of a reference signal and a feedback signal using a phase/frequency detector at 802. At 804, pulses are generated based on outputs of the phase/frequency detector using a charge pump. At 806, an output waveform is generated based on the charge pump pulses and a clock realignment signal, the clock realignment signal being based on the outputs from the phase/frequency detector.

Systems and methods as described herein may take a variety of forms. In one example, systems and methods are provided for a phase locked loop. A phase/frequency detector is configured to receive a reference signal and a feedback signal. A charge pump is configured to receive outputs from the phase/frequency detector and to generate pulses. An oscillator is configured to generate an output waveform based on the charge pump pulses. A realignment path is configured to generate a clock realignment signal that is provided to the oscillator based on the outputs from the phase/frequency detector.

In another example, a method of generating a periodic output waveform includes comparing a phase and frequency of a reference signal and a feedback signal using a phase/frequency detector. Pulses are generated based on outputs of the phase/frequency detector using a charge pump. An output waveform is generated based on the charge pump pulses and a clock realignment signal, the clock realignment signal being based on the outputs from the phase/frequency detector.

As a further example, a clock generation circuit includes a charge pump configured to receive a first input signal and a second input signal, the charge pump being configured to route the first input signal and the second input signal to respective first and second alignment logic gates, the charge pump configured to generate pulse signals based on the first and second input signals. A realignment circuit is configured to generate a realignment signal based on the first input signal and the second input signal after both are routed through a third alignment gate. An oscillator is configured to produce an output waveform based on the pulse signals and the realignment signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A phase locked loop comprising:
    a phase/frequency detector configured to receive a reference signal and a feedback signal;
    a charge pump configured to receive first and second outputs from the phase/frequency detector and to generate pulses;
    an oscillator configured to generate an output waveform based on the charge pump pulses;
    a filter between the charge pump and the oscillator; and
    a realignment path configured to generate a clock realignment signal that is provided to the oscillator based on a third output from the charge pump after the third output from the charge pump bypasses the filter and is routed through a third matching gate.

2. The loop of claim 1, wherein the charge pump comprises a first matching gate and a second matching gate.

3. The loop of claim 2, wherein the first, second, and third matching gates are all AND gates or are all OR gates.

4. The loop of claim 1, wherein the filter is a low pass filter configured to receive the pulses from the charge pump and to generate an input to the oscillator.

5. The loop of claim 1, wherein the clock realignment signal is periodically generated to reset any accumulated error in the phase locked loop.

6. The loop of claim 1, wherein the realignment path receives no input from before the phase/frequency detector.

7. The loop of claim 1, wherein the realignment path does not include a programmable delay line or a delay locked loop.

8. The loop of claim 1, further comprising a feedback path that provides the output waveform to the phase/frequency detector as the feedback signal.

9. The loop of claim 8, wherein the feedback path comprises a frequency divider.

10. The loop of claim 1, wherein the reference signal is provided to the phase/frequency detector after a delay period, wherein the delay period is determined by an automated place and route routine of computer-aided circuit design software.

11. The loop of claim 10, wherein the charge pump receives the first and second outputs from the phase/frequency detector after a second delay period, wherein the second delay period is user selectable using the computer-aided design software.

12. The loop of claim 1, wherein the realignment path comprises a pulse generator, wherein the realignment signal is generated by the pulse generator, the clock realignment signal being provided to the oscillator.

13. The loop of claim 12, wherein a pulse width of the realignment signal is controllable via an input to the pulse generator.

14. The loop of claim 13, wherein the pulse width of the pulse generator is controlled so as to be:
    of shorter length than pulse widths generated by the phase/frequency detector; and
    of shorter length than one half of a period of the output wave form.

15. The loop of claim 13, wherein the input selects which of multiple timing logic gates a selection signal is provided, wherein each of the multiple timing logic gates is associated with a different pulse width of the realignment signal.

16. A method of generating a periodic output waveform, comprising:
    comparing a phase and frequency of a reference signal and a feedback signal using a phase/frequency detector;
    generating pulses based on first and second outputs of the phase/frequency detector using a charge pump;
    generating an output waveform based on the charge pump pulses and a clock realignment signal, the clock realignment signal being based on a third output from the charge pump; and
    providing the third output from the charge pump to a third alignment logic gate such that the third output bypasses a filter prior to generating the clock realignment signal.

17. The method of claim 16, further comprising:
    providing each of the first and second outputs of the phase/frequency detector to respective first and second alignment logic gates prior to being used to generate the pulses.

18. The method of claim 17, wherein the first, second, and third alignment logic gates are a common type of logic gate.

19. A clock generation circuit, comprising:
    a charge pump configured to receive a first input signal and a second input signal, the charge pump configured to route the first input signal and the second input signal to respective first and second alignment logic gates, the charge pump configured to generate pulse signals and an output signal based on the first and second input signals;
    a realignment circuit configured to generate a realignment signal based on the output signal from the charge pump after the output signal from the charge pump bypasses a filter and is routed through a third alignment logic gate; and
    an oscillator configured to produce an output waveform based on the pulse signals and the realignment signal.

20. The clock generation circuit of claim 19, wherein the first, second, and third alignment logic gates are a common type of logic gate.

* * * * *